(12) United States Patent
Kellerman et al.

(10) Patent No.: US 8,226,903 B2
(45) Date of Patent: Jul. 24, 2012

(54) REMOVAL OF A SHEET FROM A PRODUCTION APPARATUS

(75) Inventors: Peter L. Kellerman, Essex, MA (US); Frederick Carlson, Potsdam, NY (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/187,039

(22) Filed: Jul. 20, 2011

(65) Prior Publication Data

US 2011/0271901 A1 Nov. 10, 2011

Related U.S. Application Data

(63) Continuation of application No. 12/580,719, filed on Oct. 16, 2009, now Pat. No. 7,998,224.

(51) Int. Cl.
*B01D 11/02* (2006.01)
(52) U.S. Cl. ........................................ 422/270; 588/900
(58) Field of Classification Search .................. 422/266, 422/270; 23/308 R; 588/900
See application file for complete search history.

(56) References Cited

U.S. PATENT DOCUMENTS

| 7,608,146 B2 | 10/2009 | Clark |
| 2010/0025885 A1 | 2/2010 | Clark |

*Primary Examiner* — Edward Johnson

(57) ABSTRACT

A melt of a material is cooled and a sheet of the material is formed in the melt. This sheet is transported, cut into at least one segment, and cooled in a cooling chamber. The material may be Si, Si and Ge, Ga, or GaN. The cooling is configured to prevent stress or strain to the segment. In one instance, the cooling chamber has gas cooling.

11 Claims, 4 Drawing Sheets

REMOVAL OF A SHEET FROM A PRODUCTION APPARATUS

CROSS-REFERENCE TO RELATED APPLICATIONS

This is a continuation application of U.S. application Ser. No. 12/580,719 entitled "Removal of a Sheet from a Production Apparatus," filed Oct. 16, 2009, which claims priority to the provisional patent application entitled "Removal of a Silicon Sheet from a Production Apparatus," filed Oct. 21, 2008 and assigned U.S. App. No. 61/107,143, the disclosures of which are hereby incorporated by reference.

FIELD

This invention relates to sheet formation from a melt and, more particularly, to minimizing thermal stress on a sheet produced from a melt.

BACKGROUND

Silicon wafers or sheets may be used in the integrated circuit or solar cell industry, for example. Demand for solar cells continues to increase as the demand for renewable energy sources increases. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. As the demand for solar cells increases, one goal of the solar cell industry is to lower the cost/power ratio. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 μm thick. To maintain single crystal growth, the boule must be grown slowly, such as less than 10 μm/s, from a crucible containing a melt. The subsequent sawing process leads to approximately 200 μm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries and this lower quality results in lower efficiency solar cells. The sawing process for a polycrystalline silicon ingot is as inefficient as a monocrystalline silicon ingot or boule.

Another solution that may reduce silicon waste is cleaving a wafer from a silicon ingot after ion implantation. For example, hydrogen, helium, or other noble gas ions are implanted beneath the surface of the silicon ingot to form an implanted region. This is followed by a thermal, physical, or chemical treatment to cleave the wafer from the ingot along this implanted region. While cleaving through ion implantation can produce wafers without kerf losses, it has yet to be proven that this method can be employed to produce silicon wafers economically.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 μm.

Horizontal ribbons of silicon that are physically pulled from a melt also have been tested. In one method, a seed attached to a rod is inserted into the melt and the rod and resulting sheet are pulled at a low angle over the edge of the crucible. The angle and surface tension are balanced to prevent the melt from spilling over the crucible. It is difficult, however, to initiate and control such a pulling process. Access must be given to the crucible and melt to insert the seed, which may result in heat loss. Additional heat may be added to the crucible to compensate for this heat loss. This additional heat may cause vertical temperature gradients in the melt that may cause non-laminar fluid flow. Also, a possibly difficult angle of inclination adjustment to balance gravity and surface tension of the meniscus formed at the crucible edge must be performed. Furthermore, since heat is being removed at the separation point of the sheet and melt, there is a sudden change between heat being removed as latent heat and heat being removed as sensible heat. This may cause a large temperature gradient along the ribbon at this separation point and may cause dislocations in the crystal. Dislocations and warping may occur due to these temperature gradients along the sheet.

Production of thin sheets separated horizontally from a melt, such as by using a spillway, has not been performed. Producing sheets horizontally from a melt by separation may be less expensive than silicon sliced from an ingot and may eliminate kerf loss or loss due to squaring. Sheets produced horizontally from a melt by separation also may be less expensive than silicon cleaved from an ingot using hydrogen ions or other pulled silicon ribbon methods. Furthermore, separating a sheet horizontally from a melt may improve the crystal quality of the sheet compared to pulled ribbons. A crystal growth method such as this that can reduce material costs would be a major enabling step to reduce the cost of silicon solar cells.

Once a sheet is produced, it must be cooled to a lower temperature, such as to room temperature. In one example, a silicon sheet is extracted from an apparatus containing molten silicon and transported to an environment with a lower temperature. Transporting a continuous or ribbon shaped sheet between environments at different temperatures may cause thermal stress in the sheet. A temperature gradient along the sheet will cause a gradient in the relaxed lattice constant. If this gradient is uniform, the lattice can remain ordered, but if this gradient varies along the sheet then dislocations can occur. If the sheet is wide and thin, stresses caused by the lateral gradients in temperature can also cause the sheet to buckle (either torsional or end buckling). Temperature variations along the sheet may, therefore, limit the useful width and thinness of the sheet. Thus, there is a need in the art for an improved method of sheet formation that minimizes thermal stress on a sheet produced from a melt, and, more particularly, an improved method of sheet removal such that the sheet can remain dislocation-free and undistorted.

SUMMARY

According to a first aspect of the invention, a method is provided. The method comprises cooling a melt of a material and forming a solid sheet of the material in the melt. The sheet is transported and cut into at least one segment. The segment is cooled.

According to a second aspect of the invention, an apparatus is provided. The apparatus comprises a vessel defining a channel configured to hold a melt of a material. A cooling plate is disposed proximate the melt and is configured to form a sheet of the material on the melt. A cutting apparatus is configured to cut the sheet into at least one segment. A cooling chamber is configured to hold the segment. The cooling chamber and the segment are configured to be at an approximately uniform lateral temperature across a surface of the segment.

According to a third aspect of the invention, an apparatus is provided. The apparatus comprises a vessel defining a channel configured to hold a melt of a material. A cooling plate is disposed proximate the melt and is configured to form a sheet of the material on the melt. A cutting apparatus is configured to cut the sheet into at least one segment. A cooling chamber is configured to hold the segment. The segment is cooled in the cooling chamber.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, or other substrates known to those skilled in the art. Furthermore, while the melt is described herein as being silicon, the melt may contain germanium, silicon and germanium, gallium, gallium nitride, other semiconductor materials, or other materials known to those skilled in the art. Thus, the invention is not limited to the specific embodiments described below.

Figure 1:
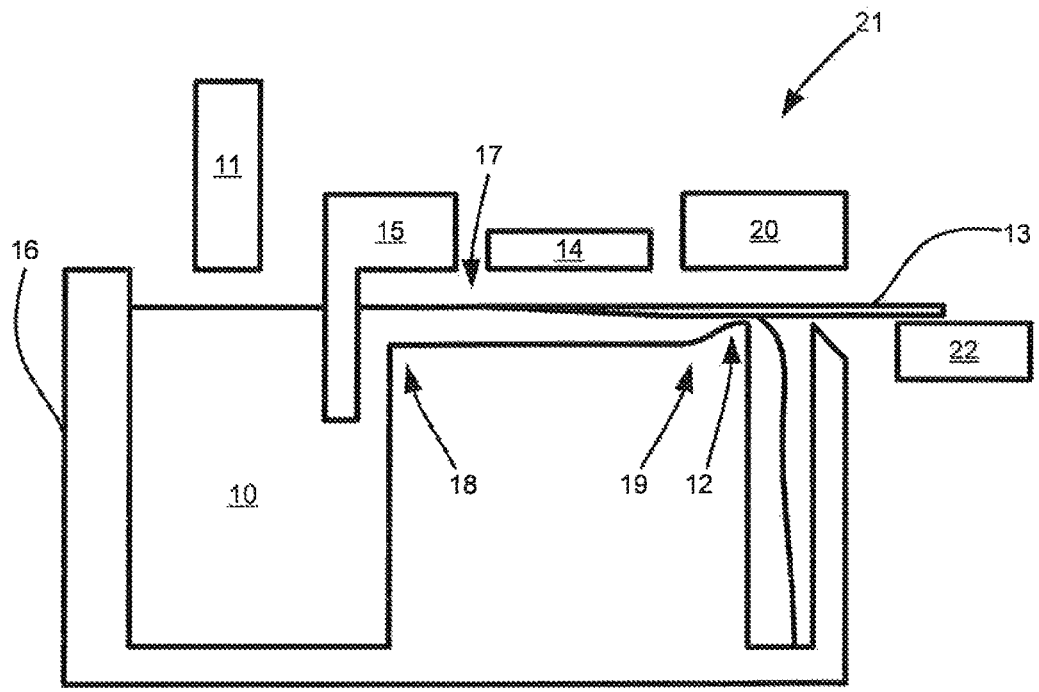
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16 and panels 15 and 20. The vessel 16 and panels 15 and 20 may be, for example, tungsten, boron nitride, aluminum nitride, molybdenum, graphite, silicon carbide, or quartz. The vessel 16 is configured to contain a melt 10. The melt 10 may be silicon. The melt 10 may be replenished through the feed 11 in one embodiment. The feed 11 may contain solid silicon. The melt 10 may be pumped into the vessel 16 in another embodiment. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. In one instance, only 10% of the sheet 13 protrudes from above the top of the melt 10. The melt 10 may circulate within the sheet-forming apparatus 21.

This vessel 16 defines at least one channel 17. This channel 17 is configured to hold the melt 10 and the melt 10 flows from a first point 18 to a second point 19 of the channel 17. In one instance, the environment within the channel 17 is still to prevent ripples in the melt 10. The melt 10 may flow due to, for example, a pressure difference, gravity, a magnetohydrodynamic drive, a screw pump, an impeller pump, a wheel, or other methods of transport. The melt 10 then flows over the spillway 12. This spillway 12 may be a ramp, a weir, a small dam, or a corner and is not limited to the embodiment illustrated in FIG. 1. The spillway 12 may be any shape that allows a sheet 13 to be separated from the melt 10.

The panel 15 is configured in this particular embodiment to extend in part below the surface of the melt 10. This may prevent waves or ripples from disturbing the sheet 13 as it forms on the melt 10. These waves or ripples may form due to addition of melt material from the feed 11, pumping, or other causes known to those skilled in the art. The panel 15 also may be used to control the level of the melt 10 in the channel 17.

In one particular embodiment, the vessel 16 and panels 15 and 20 may be maintained at a temperature slightly above approximately 1687 K. For silicon, 1687 K represents the freezing temperature or interface temperature. By maintaining the temperature of the vessel 16 and panels 15 and 20 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but may include multiple segments or sections in another embodiment. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 and panels 15 and 20 may be any temperature above the melting temperature of the melt 10. This prevents the melt 10 from solidifying on the vessel 16 and panels 15 and 20.

The apparatus 21 may be maintained at a temperature slightly above the freezing temperature of the melt 10 by at least partially or totally enclosing the apparatus 21 within an enclosure. If the enclosure maintains the apparatus 21 at a temperature above the freezing temperature of the melt 10, the need to heat the apparatus 21 may be avoided or reduced and heaters in or around the enclosure may compensate for any heat loss. This enclosure may be isothermal with anisotropic conductivity. In another particular embodiment, the heaters are not disposed on or in the enclosure and are rather in the apparatus 21. In one instance, different regions of the vessel 16 may be heated to different temperatures by imbedding heaters within the vessel 16 and using multi-zone temperature control.

The enclosure may control the environment where the apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the sheet 13 formation process.

The apparatus 21 includes a cooling plate 14. The cooling plate 14 allows heat extraction that enables the sheet 13 to form on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of, for example, graphite, quartz, or silicon carbide. The cooling plate 14 may remove heat from the liquid melt 10 quickly, uniformly, and in controlled amounts. Disturbances to the melt 10 may be reduced while the sheet 13 forms to prevent imperfections in the sheet 13.

The heat extraction of the heat of fusion and heat from the melt 10 over the surface of the melt 10 may enable faster production of the sheet 13 compared to other ribbon pulling methods while maintaining a sheet 13 with low defect density. Cooling a sheet 13 on the surface of the melt 10 or a sheet 13 that floats on the melt 10 allows the latent heat of fusion to be removed slowly and over a large area while having a relatively large sheet 13 extraction rate.

The dimensions of the cooling plate 14 may be increased, both in length and width. Increasing the length may allow a faster sheet 13 extraction rate for the same vertical growth rate and resulting sheet 13 thickness. Increasing the width of the cooling plate 14 may result in a wider sheet 13. Unlike the vertical sheet pulling method, there is no inherent physical limitation on the width of the sheet 13 produced using embodiments of the apparatus and method described in FIG. 1.

In one particular example, the melt 10 and sheet 13 flow at a rate of approximately 1 cm/s. The cooling plate 14 is approximately 20 cm in length and approximately 25 cm in width. A sheet 13 may be grown to approximately 100 µm in thickness in approximately 20 seconds. Thus, the sheet may grow in thickness at a rate of approximately 5 µm/s. A sheet 13 of approximately 100 µm in thickness may be produced at a rate of approximately 10 m$^2$/hour.

Thermal gradients in the melt 10 may be minimized in one embodiment. This may allow the melt 10 flow to be steady and laminar. It also may allow the sheet 13 to be formed via radiation cooling using the cooling plate 14. A temperature difference of approximately 300 K between the cooling plate 14 and the melt 10 may form the sheet 13 on or in the melt 10 at a rate of approximately 7 µm/s in one particular instance.

The region of the channel 17 downstream from the cooling plate 14 and the under the panel 20 may be isothermal. This isothermal region may allow annealing of the sheet 13.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking a single crystal sheet 13 because no external stress is applied to the sheet 13. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions.

The sheet 13 may be formed faster in the apparatus 21 than by being pulled normal to the melt because the melt 10 may flow at a speed configured to allow for proper cooling and crystallization of the sheet 13 on the melt 10. The sheet 13 will flow approximately as fast as the melt 10 flows. This reduces stress on the sheet 13. Pulling a ribbon normal to a melt is limited in speed because of the stresses placed on the ribbon due to the pulling. The sheet 13 in the apparatus 21 may lack any such pulling stresses in one embodiment. This may increase the quality of the sheet 13 and the production speed of the sheet 13.

The sheet 13 may tend to go straight beyond the spillway 12 in one embodiment. This sheet 13 may be supported after going over the spillway 12 in some instances to prevent breakage. A support device 22 is configured to support the sheet 13. The support device 22 may provide a gas pressure differential to support the sheet 13 using, for example, a gas or air blower. After the sheet 13 is separated from the melt 10, the temperature of the environment where the sheet 13 is located may slowly be changed. In one instance, the temperature is lowered as the sheet 13 moves farther from the spillway 12.

In one instance, the growth of the sheet 13, annealing of the sheet 13, and separation of the sheet 13 from the melt 10 using the spillway 12 may take place in an isothermal environment. The separation using the spillway 12 and the approximately equal flow rates of the sheet 13 and melt 10 minimize stress or mechanical strain on the sheet 13. This increases the possibility of producing a single crystal sheet 13.

In another embodiment, a magnetic field is applied to the melt 10 and sheet 13 in the sheet-forming apparatus 21. This may dampen oscillatory flows within the melt 10 and may improve crystallization of the sheet 13.

Figure 2:
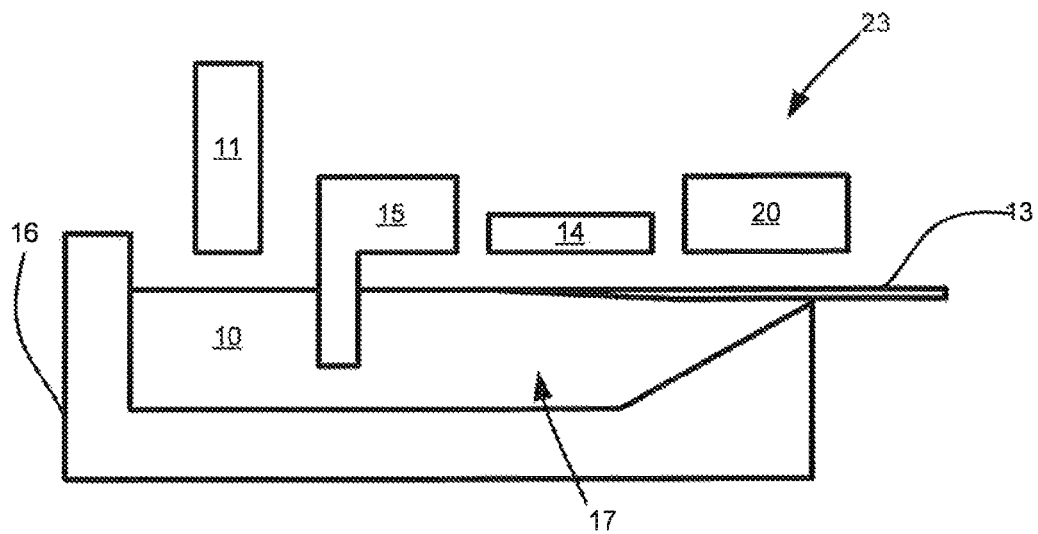
FIG. 2 is a cross-sectional side view of an embodiment of an apparatus that pulls a sheet from a melt.

FIG. 2 is a cross-sectional side view of an embodiment of an apparatus that pulls a sheet from a melt. In this embodiment, the sheet-forming apparatus 23 transports the sheet 13 by pulling the sheet 13 from the melt 10. The melt 10 may not be circulating in a channel 17 in this embodiment and the sheet 13 may be pulled using a seed. A sheet 13 may be formed through cooling by the cooling plate 14 and the resulting sheet may be drawn out of the melt 10.

Both the embodiments of FIGS. 1-2 use a cooling plate 14. Different cooling temperatures across the length of the cooling plate 14, different flow rates of the melt 10 or pull speeds of the sheet 13, the length of the various sections of the sheet-forming apparatus 21 or sheet-forming apparatus 23, or the timing within the sheet-forming apparatus 21 or sheet-forming apparatus 23 may be used for process control. If the melt 10 is silicon, a polycrystalline sheet 13 or single crystal sheet 13 may be formed in the sheet-forming apparatus 21. In either the embodiment of FIG. 1 or FIG. 2, the sheet-forming apparatus 21 or sheet-forming apparatus 23 may be contained in an enclosure.

FIG. 1 and FIG. 2 are only two examples of sheet-forming apparatuses that can form sheets 13 from a melt 10. Other apparatuses or methods of vertical or horizontal sheet 13 growth are possible. While the embodiments of the methods and apparatuses described herein are specifically described with respect to the sheet-forming apparatus of FIG. 1, these embodiments may be applied to any vertical or horizontal sheet 13 growth method or apparatus. Thus, the embodiments described herein are not limited solely to the specific embodiments of FIGS. 1-2.

Peak strain on a sheet 13 may occur at the edges of the width (the Z-direction illustrated in FIG. 3) of a sheet 13. Strain due to temperature gradients may cause deformations or displacements in the sheet 13. Such a temperature gradient describes the direction and rate that a temperature changes around a particular location. Due to these deformations or displacements, it is desirable in some instances to minimize the temperature gradient along the sheet 13. Reducing temperature gradients during cooling of the sheet 13 may reduce any strain on the sheet 13.

Figure 3:
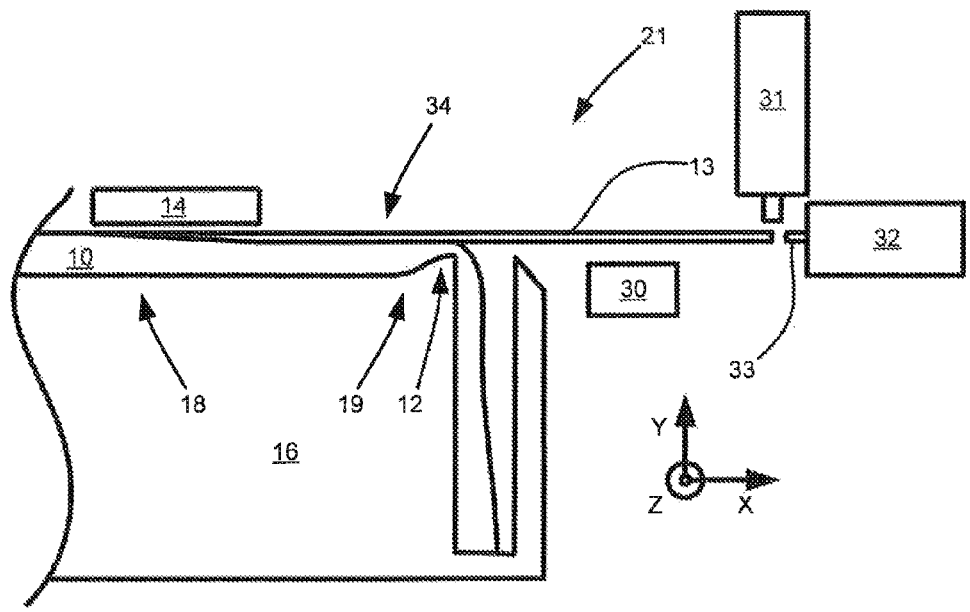
FIG. 3 is a cross-sectional side view of an embodiment of an apparatus that produces a sheet from a melt.

FIG. 3 is a cross-sectional side view of an embodiment of an apparatus that produces a sheet from a melt. While this particular embodiment in FIG. 3 uses the sheet-forming apparatus 21, embodiments of FIG. 3 may likewise be used with sheet-forming apparatus 23 or another apparatus that forms a sheet 13 from a melt 10. The embodiment of FIG. 3 reduces any temperature gradient experienced by the sheet 13. The sheet 13 is formed by the sheet-forming apparatus 21. Latent heat is removed through the sheet 13 during exposure to the cooling plate 14 and a temperature gradient is imposed across the height or thickness (the Y-direction illustrated in FIG. 3) of the sheet 13. The sheet 13 may be annealed in the region 34 due to the temperature of the melt 10. A near-uniform temperature may be maintained in the region 34. This temperature in the region 34 may be slightly above the temperature of the melt 10 in one instance, resulting in some of the sheet 13 melting back into the melt 10. This temperature in the region 34 also results in the annealing of the strain in the sheet 13 that occurred during the forming or crystallization process under the cooling plate 14.

As the sheet 13 separates from the melt 10 at the spillway 12, the sheet 13 is transported away from the sheet-forming apparatus 21. A support unit 30 will keep the sheet 13 horizontal and level. The support unit 30 may be a gas or air blower, a fluid bearing, or some other support system.

A cutting apparatus 31 cuts the sheet 13 into at least one segment 33. Here, the segment 33 is shown partly protruding from the cooling chamber 32. A laser cutter, hot press, or a saw, for example, may be used as a cutting apparatus 31. A segment 33 is a square, rectangular, or other shaped portion of the sheet 13. The sheet 13 may be cut by the cutting apparatus 31 after the sheet 13 has been annealed in the melt 10, the region 34, or some other high-temperature area. The sheet 13 may be supported during cutting using, for example, a fluid table, a fluid bearing, or some other apparatus known to those skilled in the art. This support during cutting prevents disturbances to the growth of the sheet 13 upstream of the cutting.

The segment 33 of the sheet 13 then may be cooled in the cooling chamber 32. While FIG. 3 illustrates one segment 33 being loaded into a cooling chamber 32, more than one segment 33 may be loaded into the cooling chamber 32. The cooling chamber 32 may maintain a spatially-uniform temperature that is reduced over time. The difference in temperature between the cooling chamber 32 and the segment 33 may be minimized in one particular embodiment. A controlled cooling may then occur in the cooling chamber 32 such that thermal stress or other strain on the segment 33 is minimized. This may minimize any temperature gradient from being introduced in the sheet 13 or segment 33. If a temperature gradient is minimized or avoided, this will produce a higher-quality sheet 13 or segment 33. This also may enable a wider sheet 13 or segment 33.

Those skilled in the art will recognize that in such a cooling chamber 32, creating a decreasing temperature over time may use some spatial temperature gradients to remove the heat from the interior of the cooling chamber 32 or segment 33. To the extent that these gradients are normal to the area of the sheet 13 or segment 33, the temperature difference between the top and bottom of the sheet 13 or segment 33 along the Y-direction in FIG. 3 may be negligible. The avoidance of any lateral temperature gradients will remove the possibility of the sheet 13 or segment 33 warping, thus removing the constraints on the size of the sheet 13 or segment 33. Lateral in this case means across the surface of the segment 33 or sheet 13, or in the X-direction or Z-direction illustrated in FIG. 3.

Once the segment 33 is loaded into the cooling chamber 32, the cooling chamber 32 may be removed or transported away from the sheet-forming apparatus 21. This may be performed robotically, on a conveyor belt, or in other cluster or mechanical systems. In one instance, multiple systems 32 are used and are cycled during the production of the sheet 13 and segments 33. The cooling chamber 32 may remain isothermal or near-isothermal, such as in a spatial or lateral (X-direction or Z-direction illustrated in FIG. 3) sense, for some time before the cooling chamber 32 slowly lowers the temperature of the segment 33 to minimize stress or strain on the segment 33.

Figure 4:
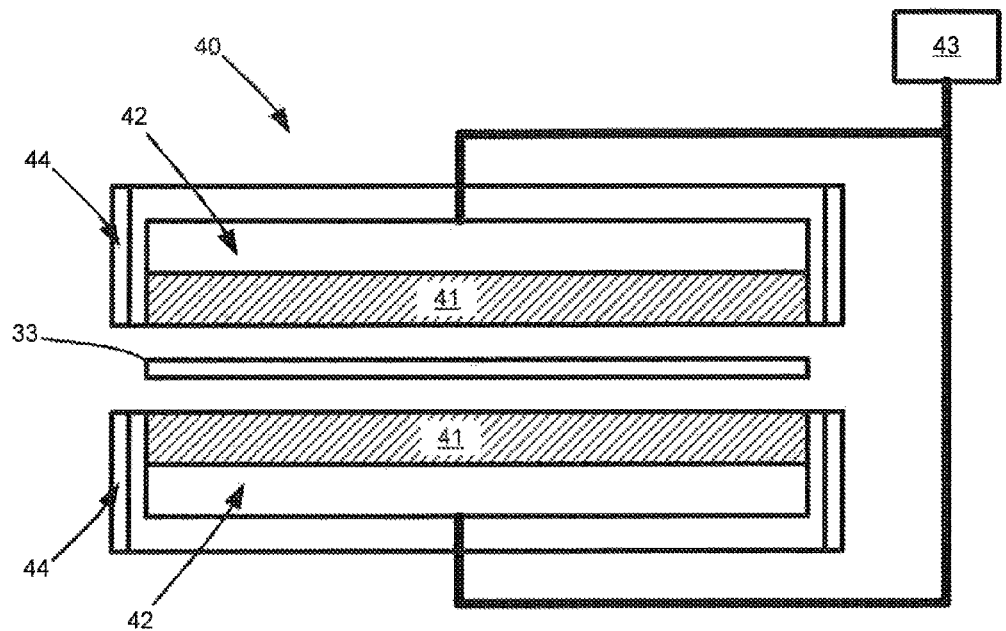
FIG. 4 is a cross-sectional side view of an embodiment of a gas-cooled isothermal system.

FIG. 4 is a cross-sectional side view of an embodiment of a gas-cooled isothermal system. The cooling chamber 40 in FIG. 4 is one example of the cooling chamber 32 in FIG. 3. The segment 33 rests in the cooling chamber 40 in a spatially isothermal or near-isothermal environment. The segment 33 may be disposed on a surface in the cooling chamber 40. Gas convection cooling is done in the cooling chamber 40 so the cooling chamber 40 and the segment 33 remain spatially isothermal or near-isothermal and are slowly lowered to, for example, room temperature. Thus, the cooling chamber 40 may be loaded with a segment 33 at a high temperature that is later removed at a lower temperature with a reduced amount of defects compared to active cooling of the sheet 13.

The cooling chamber 40 has a porous material 41, such as a porous ceramic, in proximity to the segment 33. The porous material 41 is in fluid communication with a gas source 43 using conduits 42. The porous material 41 may be sintered or drilled in one particular embodiment. An inert gas, such as H, N, He, or another noble gas, may flow from the gas source 43 through the porous material 41 so that the cooling chamber 40 is spatially isothermal or cooled in a controlled manner. A scavenge ring 44 may be used to capture the gas to prevent the gas from having an effect on the surroundings of the cooling chamber 40. Thermal insulation may surround the cooling chamber 40 to further minimize the effect on the surroundings of the cooling chamber 40. The cooling chamber 40 is configured to have a spatially isothermal or near-isothermal environment, such as in a lateral (X-direction or Z-direction illustrated in FIG. 3) sense, during loading and transport of the segment 33 and during cooling to prevent stress or strain to the segment 33. The segment 33 may have an approximately uniform lateral temperature across the segment 33 during cooling. Lateral in this case means across the surface of the segment 33 or sheet 13, or in the X-direction or Z-direction illustrated in FIG. 3.

Figure 5:
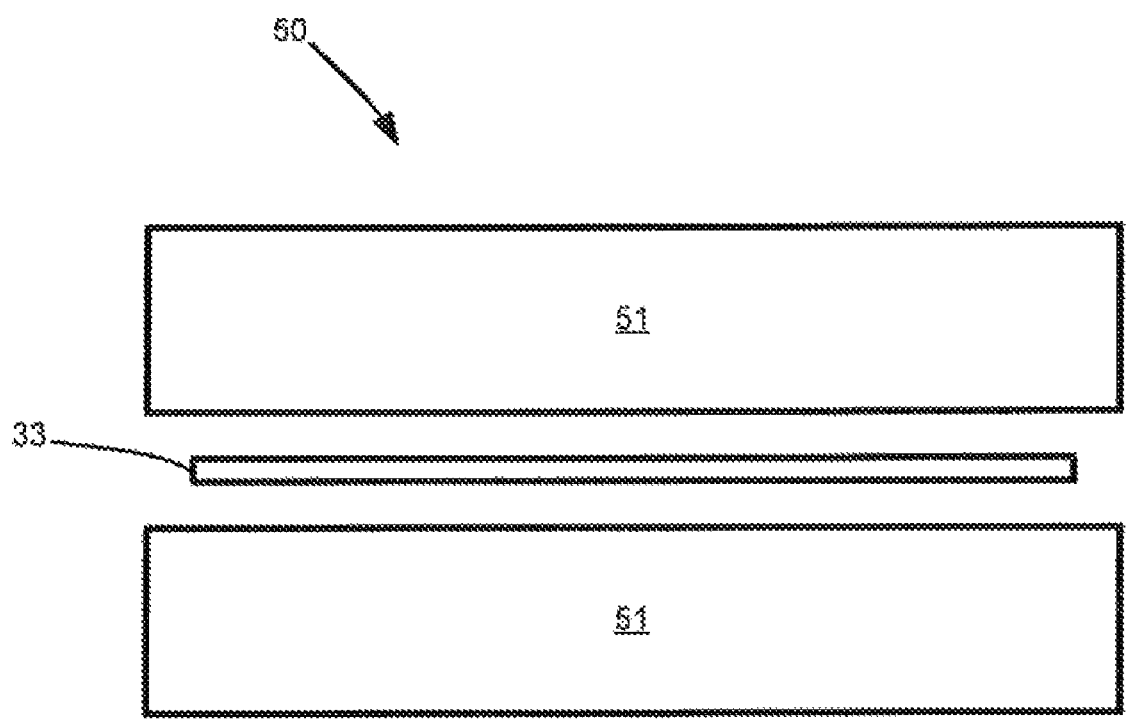
FIG. 5 is a cross-sectional side view of an embodiment of an anisotropic isothermal system.

FIG. 5 is a cross-sectional side view of an embodiment of an anisotropic isothermal system. The cooling chamber 50 in FIG. 5 is another example of the cooling chamber 32 in FIG. 3. In this particular embodiment, the segment 33 is surrounded by slabs 51 of an anisotropic material such as pyrolytic graphite. The segment 33 may be disposed on a surface in the cooling chamber 50. The segment 33 is held at a uniform temperature because as the cooling chamber 50 is transported to regions of different temperatures or the temperature around the cooling chamber 50 changes, the dimensions of the slabs 51 are configured to keep the segment 33 in a spatially isothermal or near-isothermal environment, such as in a lateral (X-direction or Z-direction illustrated in FIG. 3)

sense. For example, the slabs 51 may have a lateral dimension that is approximately 50% larger than that of the segment 33. The segment 33 then slowly adjusts to temperature changes in the outside environment. This particular embodiment allows cooling to occur by transporting the segment 33 between regions of different temperatures and may not require active cooling using a gas. In one instance, the cooling chamber 50 has vertical temperature gradients within the cooling chamber 50 and segment 33. Thermal conductance may be used to keep a lateral isothermal or near-isothermal condition and have heat removed transversely rather than laterally. The anisotropic thermal conductivity may be greater laterally than transversely. Lateral in this case means across the surface of the segment 33 or sheet 13, or in the X-direction or Z-direction illustrated in FIG. 3. Transversely in this case means across the thickness of the sheet, or in the Y-direction illustrated in FIG. 3.

Figure 6:
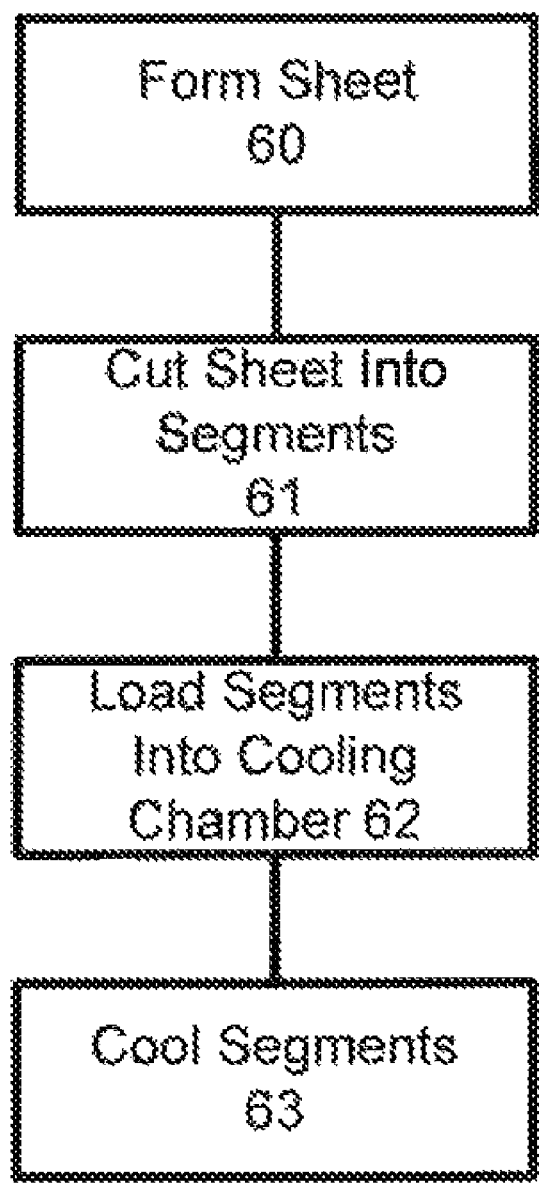
FIG. 6 is a flowchart of a process using the embodiment of FIG. 3.

FIG. 6 is a flowchart of a process using the embodiment of FIG. 3. While the cooling chamber 40 and cooling chamber 50 are illustrated, other embodiments of the cooling chamber 32 are possible and the cooling chamber 32 is not solely limited to the embodiments of the cooling chamber 40 and cooling chamber 50. A sheet is formed 60, such as in sheet-forming apparatus 21 or sheet-forming apparatus 23. This sheet is then cut into segments 61. The segments are loaded into a cooling chamber 62 and the segments are cooled 63. The segments may be cooled 63 such that the segments remain spatially isothermal or near-isothermal to prevent defects. The segments may be transported before, during, or after the segments are cooled 63. This cooling 63 may use gas cooling, may move the segments to different regions at different temperatures, or may modify the temperature around the segments.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus comprising:
   a vessel defining a channel configured to hold a melt of a material;
   a cooling plate disposed proximate said melt, said cooling plate configured to form a sheet of said material on said melt with radiation cooling;
   a cutting apparatus configured to cut said sheet into at least one segment; and
   a cooling chamber configured to hold said segment, wherein said cooling chamber and said segment are configured to be at an approximately uniform lateral temperature across a surface of said segment.

2. The apparatus of claim 1, wherein said material is selected from the group consisting of Si, Si and Ge, Ga, and GaN.

3. The apparatus of claim 1, wherein said cooling chamber comprises a cooling mechanism.

4. The apparatus of claim 3, wherein said cooling mechanism comprises a plurality of conduits and a gas source.

5. The apparatus of claim 3, wherein said cooling chamber comprises at least one porous material.

6. The apparatus of claim 5, further comprising a plurality of conduits and a gas source in fluid communication with said porous material.

7. The apparatus of claim 1, wherein said cooling chamber is configured to change said approximately uniform lateral temperature over a period of time.

8. The apparatus of claim 7, wherein said approximately uniform lateral temperature is lowered to room temperature.

9. The apparatus of claim 7, wherein said cooling chamber and said segment are cooled without producing a lateral thermal gradient across said surface of said segment.

10. The apparatus of claim 1, wherein said cooling chamber has a plurality of walls disposed above and below said segment, said walls having anisotropic thermal conductivity that is approximately greater laterally across said surface of said segment than transversely across a thickness of said segment.

11. The apparatus of claim 10, wherein said cooling chamber is composed of pyrolytic graphite.

* * * * *